United States Patent [19]

Bura

[11] Patent Number: 4,489,487

[45] Date of Patent: Dec. 25, 1984

[54] ELECTRONIC COMPONENT AND ADHESIVE STRIP COMBINATION, AND METHOD OF ATTACHMENT OF COMPONENT TO A SUBSTRATE

[75] Inventor: Ernst Bura, Bickenbach, Fed. Rep. of Germany

[73] Assignee: Robert Bosch GmbH, Stuttgart, Fed. Rep. of Germany

[21] Appl. No.: 344,410

[22] Filed: Feb. 1, 1982

[30] Foreign Application Priority Data

Feb. 10, 1981 [DE] Fed. Rep. of Germany ....... 3104623

[51] Int. Cl.³ .................... H05K 3/34; B65D 73/02
[52] U.S. Cl. .................. 29/840; 29/832; 29/589; 206/330; 206/460; 206/813; 357/80
[58] Field of Search ............. 29/832, 834, 840, 830, 29/589; 206/330, 460, 813; 174/68.5; 357/80

[56] References Cited

U.S. PATENT DOCUMENTS

| | | | |
|---|---|---|---|
| 3,698,076 | 10/1972 | Kingsley | 29/589 X |
| 4,139,881 | 2/1979 | Shimizu et al. | 361/400 |
| 4,145,390 | 3/1979 | Zschimmer | 29/832 X |
| 4,208,005 | 6/1980 | Nate et al. | 29/834 X |
| 4,219,927 | 9/1980 | Fukutomi et al. | 174/68.5 X |
| 4,312,692 | 1/1982 | Ikeda et al. | 29/832 X |
| 4,356,374 | 10/1982 | Noyori et al. | 29/589 X |

FOREIGN PATENT DOCUMENTS

| | | | |
|---|---|---|---|
| 743248 | 9/1966 | Canada | 174/68.5 |
| 55-53448 | 4/1980 | Japan | 357/80 |

*Primary Examiner*—Howard N. Goldberg
*Assistant Examiner*—Carl J. Arbes
*Attorney, Agent, or Firm*—Frishauf, Holtz, Goodman & Woodward

[57] ABSTRACT

To apply an electronic component such as an active or passive element of essentially block form with end strips or caps of conductive material to a substrate such as a printed circuit (PC) board, for subsequent soldering of the conductive strips or caps to conductors on the PC board by immersion or wave-soldering of the component and PC board in a solder bath, a controlled amount of adhesive is applied on the surface of the component between the end strips, to leave clearance space between the adhesive material and the end strips, so that the amount of material being applied can be accurately controlled. The adhesive material, preferably, is applied in form of a double-faced, double-sided adhesive strip, possibly with an intermediate foam or similar core so it can compress; the thickness of the core can be matched to the thickness of the end strips or caps. The clearance space avoids interference between adhesive material and solder connections between the end strips or caps and the conductive strips on the PC board.

12 Claims, 4 Drawing Figures

ELECTRONIC COMPONENT AND ADHESIVE STRIP COMBINATION, AND METHOD OF ATTACHMENT OF COMPONENT TO A SUBSTRATE

Reference to related publication: German Patent Disclosure Document DE-OS No. 27 55 926, to which U.S. Pat. No. 4,139,881, SHIMIZU et al., corresponds. "Funkschau", 1976, issue 20, p. 855.

The present invention relates to a method and structure to attach electronic components to a substrate, and more particularly electronic components having a plane flat surface tightly against a substrate such as a printed circuit (PC) board.

BACKGROUND

German Patent Disclosure Document DE-OS No. 27 55 926 to which U.S. Pat. No. 4,139,881, SHIMIZU et al., corresponds describes a circuit arrangement in which a flat plate such as a PC board with electric circuit tracks thereon is coupled to active and/or passive electronic components which do not have any projecting connecting tracks but, rather, plane or flat electrode surfaces at their external circumference for connection to conductors on the PC board. The electronic components may be capacitors, resistors, semiconductors, and the like, and are typically formed as rectangular blocks, with conductive bands or end caps at the terminal surfaces. The elements are frequently quite flat and are also referred to as chips as such.

Circuit arrangements of this type permit tightly positioned closely arranged location of components placed on both sides of a PC board. Discrete components having projecting wire ends are connected to the PC board from the free side thereof by extending the projecting pins through openings or bores to the side containing the conductive tracks. The conductive track side, also referred to as the solder side, then has the chip elements applied thereto. In accordance with customary attachment methods, the chip elements are first temporarily adhered by a drop of adhesive to the PC board and then secured to the PC board by dip-soldering in a bath of molten solder, simultaneously with connection the discrete elements having the extended wire portions passing through the PC board.

Application of adhesives to the PC board requires skill, since the elements are tiny. The quantity of adhesive to be applied must, on the one hand, be sufficient to securely retain the chip element in position until the solder step is completed; if, however, too much adhesive is applied, it may squeeze out from the application point upon pressing of the chip element against the PC board, and then can coat the conductive track connection, resulting in a poor solder joint, or failure of soldering at all.

The literature reference "Funkschau", 1976, issue 20, p. 855, describes a method to solder chip elements with plane flat terminal contacts to a substrate by inverting the PC board, so that the chip element will come to lie on the top side of a pre-tinned substrate, and then passing the PC board over a heater plate. The heat necessary to melt the solder must be applied through the PC board, i.e. the substrate. This system is not suitable for PC boards which are to have elements applied to both sides thereof, and is unsuitable for combination with dip-soldering or wave soldering.

THE INVENTION

It is an object to provide a method to attach electronic components to a substrate for soldering by dip-soldering, wave-soldering or the like, which is suitable for mass production without the danger of formation of defective solder joints.

Briefly, a controlled amount of adhesive is applied on the surface of the component between the end caps thereof, leaving a clearance space between the adhesive material and the end caps, and the element is then pressed with its surface against the substrate.

Applying the adhesive not on the substrate, as heretofore customary, has the advantage that the amount of adhesive applied can be accurately measured because the chip element itself provides a gauge for the quantity of adhesive to be applied. The terminals, in the form of end caps or bands of the chip elements, can readily be visually distinguished from the remainder of the housing of the chip element and, upon application of a drop or dot of adhesive, the quantity can readily be controlled so that sufficient space is left between the end bands or caps and the farthest possible reach of the adhesive upon pressing of the chip element against the PC board, so that the adhesive will not squeeze out over the connection area.

Applying the adhesive to the chip element has the additional advantage that this step can be carried out upon manufacture of the chip element, with the adhesive covered by a film until needed, and then peeling off the chip element from the film. The adhesive, additionally, may be in form of an epoxy, in which the adhesive applied to the chip element forms one part of the epoxy, for example the resin itself, with the hardener or curing agent being applied to the substrate, typically the PC board.

The method has the advantage that it is suitable for soldering of components located at the bottom of a PC board, that is, for overhead soldering; the quantity of the adhesive being applied can be accurately controlled, and can be independent of the attention given to the process by an operator, since it can be mechanically applied to the chip element itself upon manufacture thereof.

In accordance with a particularly suitable embodiment, which is preferred, the adhesive is applied in form of a double-sided adhesive strip or tape, in which the side of the double-sided adhesive tape which is remote from the chip element itself, and which thus is subject to exposure, is covered by a protective foil during transport and storage of the chip element, being peeled off upon application to a PC board. The thickness of the foil can be matched to the thickness of the end terminals so that a snug connection of the chip element and the terminals on the PC board will be obtained.

DRAWINGS

Figure 1:
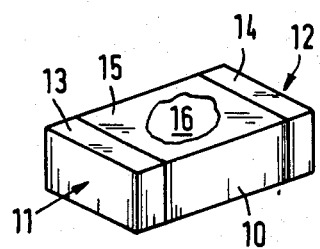
FIG. 1 is a pictorial representation of a chip element with the adhesive applied.
Figure 4:
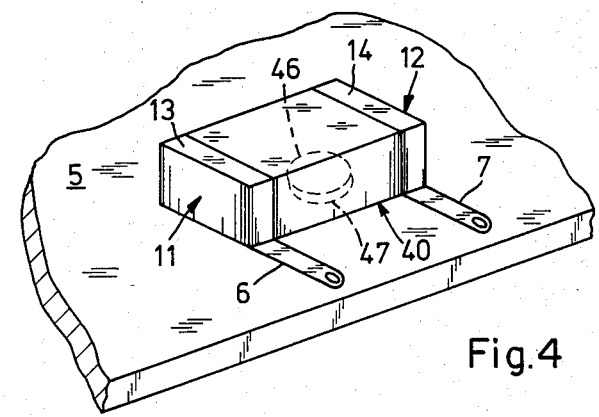
FIG. 4 illustrates a chip element applied to a PC board substrate prior to soldering, with the PC board upside-down so that the chip will be visible.

An essentially block-like miniaturized active or passive electronic component, within a housing of essentially rectangular cross section and base outline, is shown at 10 in FIG. 1; such an element is used in many miniaturized circuit arrangements, particularly in hybrid circuits. The chip element 10 has oppositely positioned end surfaces 11, 12, on which flat surface contacts 13, 14 are formed in the shape of end caps or end bands surrounding the chip element. Surface 15 is the surface for attachment of the chip element to a substrate, such as a printed circuit (PC) board 5 (FIG. 4). The chip element 10 of FIG. 1 is shown in the position in which it is to be attached to a PC board, that is, the board 5 will be placed on top of it. To connect the chip element 10 to the PC board 5—shown only in FIG. 4—before soldering, and to prevent it from falling off the PC board—a dot of adhesive 16 of a predetermined quantity is located on the surface 15. Preferably, the adhesive 16 is a material which does not lose adhesion upon storage and handling. To protect the adhesive surface, the dot 16, or the entire surface 15 of the chip element 10, possibly including the adjacent surfaces of the end strips or caps 13, 14, can be covered by a protective foil.

The dot 16 can readily be applied mechanically at the time that the chip element 10 is made, leaving clearance space between the dot of adhesive 16 and the adjacent edges of the caps or bands, 13, 14 so that, even if the dot 16 is squeezed against a plane flat surface of a PC board, it will not expand and reach over the connecting surfaces of the caps or strips 13, 14.

In accordance with a feature of the invention, a protective foil 8 (FIG. 3) is used in form of a strip or web or sheet which, simultaneously, can be used to secure together a number of similar chips, for example for subsequent automatic insertion or attachment. The strip or web 8 has a number of chips located thereon in regularly recurring distances or patterns.

Figure 2:
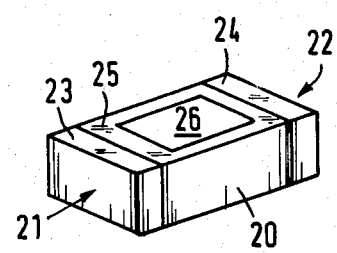
FIG. 2 is a pictorial representation of another embodiment of a chip element.

Embodiment of FIG. 2: Chip 20 is similar to chip 10; the surfaces 21, 22 have contacting regions or contacting surfaces 23, 24 overlapping the ends, in the form of end caps. The surface 25, on which the PC board is to be attached, has a strip 26 of a double-sided adhesive tape applied thereto. The basis of the tape can be in accordance with any well known and suitable double-sided adhesive, for example plastic or a textile. Double-sided, double-adhesive strips or tapes are commercial articles of trade and are frequently used in industry for temporary or permanent attachment of structural components. The side 25 of element 20 is the side which will later on face the PC board. Thus, the side of the adhesive strip 26, prior to attachment, is preferably protected by a covering foil or strip, see strip 8 (FIG. 3), which simultaneously can be used to form a storage carrier for a plurality of chips 20 and additionally to position and locate the various chips in predetermined arrangement for subsequent attachment to a PC board.

Figure 3:
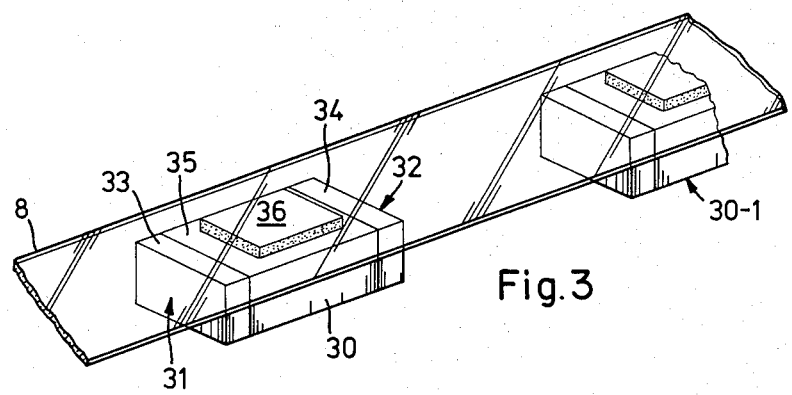
FIG. 3 is a pictorial representation of another embodiment of chip elements positioned on a continuous foil web.

Embodiment of FIG. 3: The chip 30 has its end sides 31, 32 covered with caps 33, 34 extending around the chip 30. The surface 35, which is the surface to face the PC board, has a strip 36 applied thereto which is made of elastic material, retaining its elasticity for a long period of time. The strip 36 is formed with adhesive at both major surfaces thereof. One of the major adhesive surfaces of strip 36 is secured to the chip 30; the other surface is temporarily attached to a holding strip or foil or film 8, forming a temporary storage web or tape or strip. A plurality of chips 30, 30-1 . . . 30-n can be located on the web or tape 8 for automatic removal and attachment to a PC board with the surface previously facing the web or tape 8 then facing the PC board. Foil or strip or web 8 is wider than the elements formed by chips 30. Upon soldering of the chips 30, 30-1 . . . 30-n to the PC board, the orientation of the chip as shown in FIG. 3 will be maintained, that is, the chips 30 are soldered to the substrate from below, so that the chips 30 must be securely retained on the substrate prior to and during soldering to prevent them from falling off.

The strip forming the adhesive 36, formed of elastic material which retains its elasticity, is a particularly good adhesive element since its thickness can be so arranged that the distance between the surface 35 of the chip 30 and the surface of the PC board can be readily bridged. The end caps 33, 34 increase the distance between the surface 35 of the chip 30 and the portion of a PC board which does not carry conductive tracks. The elasticity of the strip 36 is preferably so selected that the distance, due to the thickness of the caps 33, 34, is reliably bridged without, however, applying a force on the chip sufficient to lift off the component 30 from the substrate or PC board.

Strip 30 can also be made of a plastic material capable of being compressed, in which the material is so selected that, upon compression, it does not change its spatial extent, but merely contracts in volume, for example by being made with a core of a compressible foam material which retains a compressed state. Strips of this kind are commercially available; they are particularly suitable to attach components 30 to PC boards in which the conductive strips of the PC boards and the end caps 33, 34 are subject to substantial manufacturing tolerances, so that the distance between a substrate or PC board and the surface 35 can vary due to tolerances in the metal components of both the elements 30 and the PC board. Strips 36 provide for reliable connection; no excessive adhesive will exude from the strip 36 or cause any contamination of the surface contacts 33, 34.

The adhesives selected, regardless of the embodiment, whether in drop form (FIG. 1) or in tape or strip form (FIGS. 2, 3) can be two-component adhesives, for example by applying one component to the chip, and another component, such as a hardener or curing agent, on a PC board, for example by screen printing.

FIG. 4 illustrates a chip 40 applied to a PC board 5 having conductive tracks 6, 7 prior to dip-soldering. The chip 40, with end caps 13, 14 on end surfaces 11, 12, has one component 46 of a two-component hardener applied thereto, the other component 47 being applied to the PC board 5 by screen printing. The quantity of the component 47 applied between the conductors 6, 7 can be substantially less than the quantity of an adhesive sufficiently strong to hold the entire chip in position; it need only be enough to provide chemical curing or setting for the adhesive 46 on the chip 40. Many epoxy compounds require less hardener—by volume—than resin. After setting or curing, the PC board 5 is inverted, and element 40 can be dip-soldered to the PC board 5 by solder connection of the caps 13, 14 with the conductive tracks 6, 7.

Various changes and modifications may be made, and features described in connection with any one of the embodiments may be used with any of the others, within the scope of the inventive concept.

For example, and in accordance with a preferred form, the material 16 (FIG. 1) or the adhesives 26, 36, 46, 47 have such strength that they form a continuous adhesive bond, that is, a bond which, once established, cannot be readily severed without danger of damage to either the substrate, typically a PC board, and/or the respective surface 15, 25, 35 of the chip.

What is claimed is:

1. Electronic component (10, 20, 30, 40) and adhesive strip combination, in which the component is adapted for attachment to a substrate (5) such as a printed circuit board, said component having
   a flat engagement surface (15, 25, 35) and end connecting strips (13, 14; 23, 24; 33, 34) of conductive material extending along marginal portions of said engagement surface,
   a double-sided adhesive strip (26, 36) having continuous bonding characteristics adhered with one adhesive side thereof on said engagement surface between the end strips with clearance between said end connecting strips and said tape or strip;
   and a strippable foil (8) covering said strip at the side remote from said flat engagement surface to protect the adhesive side of said adhesive strip remote from the side adhered to the component but permit stripping the component off the foil (8) prior to engagement with the substrate.

2. Combination according to claim 1, wherein said double-sided adhesive strip (36) includes an elastic core.

3. Component according to claim 2, wherein said elastic core comprises a plastic material.

4. Combination according to claim 1, in further combination with a plurality of other similar component-adhesive strip combinations (30-1 . . . 30-n), wherein said foil (8) is in strip form, and said conponents are retained on said foil in predetermined location thereon.

5. Combination according to claim 1, wherein said strip of strippable foil is wider than said component.

6. Combination according to claim 4, wherein said strip of strippable foil is wider than said component.

7. Combination according to claim 5, wherein said double-sided adhesive strip (36) includes an elastic core.

8. Combination according to claim 7, wherein said double-sided adhesive strip (36) includes an elastic core.

9. Method of attaching an electronic component (10, 20, 30, 40) on a substrate (5) in which the component has a flat engagement surface (15, 25, 35) and end strips (13, 14; 23, 24; 33, 34) of conductive material positioned thereon, comprising the steps of
   providing a component with a flat engagement surface;
   applying, on said flat engagement surface, one side of a double-sided adhesively faced adhesive tape (26, 36) in a region between the end strips, while leaving a clearance space between said adhesive tape and the end strips;
   and adhering, in predetermined location, a strip of strippable foil, by engaging the other adhesive surface of the double-sided tape with the strip of strippable foil to protect the adhesive tape but permit stripping of the components off the strip of strippable foil prior to engagement of the component with the substrate;
   stripping said component together with said adhesive tape off the foil;
   transferring said component having said exposed adhesive surface to the substrate;
   and engaging said component with said surface and said adhesive tape thereon against the substrate.

10. Method according to claim 9, wherein the substrate comprises a printed circuit board (5)
    including the step of positioning the substrate with a surface carrying conductive tracks facing downwardly, said component being suspended from said surface of the substrate and held thereagainst by said adhesive tape;
    stripping the component off the strippable foil;
    and engaging the component on said downwardly facing surface of the substrate with molten solder to solder the end strips on the element to the conductive tracks (6, 7) on the printed circuit board (5).

11. Method according to claim 9, wherein (FIG. 3) said double-sided adhesive tape (36) includes a core permitting change of volume of the core to vary the distance between the adhesive sides thereof.

12. Method according to claim 9, wherein said double-sided adhesive tape (36) includes a core permitting change of volume of the core to vary the distance between the adhesive sides thereof.

* * * * *

UNITED STATES PATENT AND TRADEMARK OFFICE
CERTIFICATE OF CORRECTION

PATENT NO. : 4,489,487
DATED : December 25, 1984
INVENTOR(S) : Ernst BURA

It is certified that error appears in the above-identified patent and that said Letters Patent is hereby corrected as shown below:

Claim 8, column 5, line 40, change "according to claim 7" to -- according to claim 4 --

Claim 4, column 5, line 32, line 33, change "conponent" to -- components --

Signed and Sealed this

Thirteenth Day of August 1985

[SEAL]

Attest:

DONALD J. QUIGG

*Attesting Officer*     *Acting Commissioner of Patents and Trademarks*